US010784825B2

(12) United States Patent
Jang et al.

(10) Patent No.: US 10,784,825 B2
(45) Date of Patent: *Sep. 22, 2020

(54) RF POWER AMPLIFIER WITH FREQUENCY SELECTIVE IMPEDANCE MATCHING NETWORK

(71) Applicant: Cree, Inc., Durham, NC (US)

(72) Inventors: Haedong Jang, San Jose, CA (US); Timothy Canning, Morgan Hill, CA (US); Bjoern Herrmann, Morgan Hill, CA (US); Zulhazmi Mokhti, Morgan Hill, CA (US); Frank Trang, San Jose, CA (US); Richard Wilson, Morgan Hill, CA (US)

(73) Assignee: CREE, INC., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/516,667

(22) Filed: Jul. 19, 2019

(65) Prior Publication Data

US 2019/0341893 A1 Nov. 7, 2019

Related U.S. Application Data

(63) Continuation of application No. 15/879,621, filed on Jan. 25, 2018, now Pat. No. 10,411,659.

(51) Int. Cl.
*H03F 3/189* (2006.01)
*H03F 3/24* (2006.01)
(Continued)

(52) U.S. Cl.
CPC .......... *H03F 3/189* (2013.01); *H03F 1/0288* (2013.01); *H03F 1/565* (2013.01); *H03F 3/193* (2013.01);
(Continued)

(58) Field of Classification Search
CPC combination set(s) only.
See application file for complete search history.

(56) References Cited

U.S. PATENT DOCUMENTS

| 5,126,697 A | 6/1992 | Nauta et al. |
| 5,177,453 A | 1/1993 | Russel |

(Continued)

FOREIGN PATENT DOCUMENTS

| CN | 101882913 A | 11/2010 |
| CN | 205945655 U | 2/2017 |

(Continued)

OTHER PUBLICATIONS

Chen, Kenle et al., "A 3.1-GHz Class-F Power Amplifier With 82% Power-Added-Efficiency", IEEE Microwave and Wireless Components Letters, vol. 23, No. 8, Jul. 16, 2013, pp. 436-438, IEEE.

(Continued)

*Primary Examiner* — Linda Wong
(74) *Attorney, Agent, or Firm* — Coats & Bennett, PLLC (57) ABSTRACT

An amplifier circuit includes an input port, an output port, and a reference potential port, an RF amplifier device having an input terminal electrically coupled to the input port, an output terminal electrically coupled to the output port, and a reference potential terminal electrically coupled to the reference potential port. An impedance matching network is electrically connected to the output terminal, the reference potential port, and the output port. The impedance matching network includes a reactive efficiency optimization circuit that forms a parallel resonant circuit with a characteristic output impedance of the peaking amplifier at a center frequency of the fundamental frequency range. The impedance matching network includes a reactive frequency selective circuit that negates a phase shift of the RF signal in
(Continued)

phase at the center frequency and exhibits a linear transfer characteristic in a baseband frequency range.

17 Claims, 7 Drawing Sheets

(51) Int. Cl.
H03H 7/01 (2006.01)
H03H 7/38 (2006.01)
H03F 3/193 (2006.01)
H03F 1/02 (2006.01)
H03F 1/56 (2006.01)

(52) U.S. Cl.
CPC ............... *H03F 3/24* (2013.01); *H03H 7/01* (2013.01); *H03H 7/0115* (2013.01); *H03H 7/17* (2013.01); *H03H 7/38* (2013.01); *H03F 2200/222* (2013.01); *H03F 2200/297* (2013.01); *H03F 2200/301* (2013.01); *H03F 2200/306* (2013.01); *H03F 2200/309* (2013.01); *H03F 2200/387* (2013.01); *H03F 2200/391* (2013.01); *H03F 2200/399* (2013.01); *H03F 2200/451* (2013.01)

(56) References Cited

U.S. PATENT DOCUMENTS

| | | | |
|---|---|---|---|
| 6,252,461 B1 | 6/2001 | Raab | |
| 6,734,728 B1 | 5/2004 | Leighton et al. | |
| 7,489,188 B2 | 2/2009 | Lee | |
| 7,495,515 B1 | 2/2009 | Branch et al. | |
| 7,760,027 B2 | 7/2010 | Murji | |
| 8,193,857 B1 | 6/2012 | Wilson et al. | |
| 8,253,496 B2 | 8/2012 | Ichitsubo | |
| 8,717,099 B2 | 5/2014 | Wilson et al. | |
| 8,717,102 B2 | 5/2014 | Wilson et al. | |
| 9,054,756 B2* | 6/2015 | See | H04B 1/18 |
| 9,350,300 B2* | 5/2016 | Kim | H03F 1/0266 |
| 9,419,568 B2 | 8/2016 | Beltran | |
| 9,503,025 B2* | 11/2016 | Cao | H03F 1/0222 |
| 9,899,967 B1 | 2/2018 | Gozzi et al. | |
| 10,003,311 B1 | 6/2018 | Canning et al. | |
| 10,050,591 B2 | 8/2018 | Goel et al. | |
| 10,122,336 B1 | 11/2018 | Jang et al. | |
| 10,164,668 B2 | 12/2018 | Zhou et al. | |
| 10,236,833 B2 | 3/2019 | Arigong et al. | |
| 10,332,847 B2 | 6/2019 | Liu et al. | |
| 2001/0004224 A1 | 6/2001 | Lerke et al. | |
| 2005/0242877 A1 | 11/2005 | Kusunoki et al. | |
| 2008/0191801 A1* | 8/2008 | Kim | H03F 1/0288 330/124 R |
| 2010/0164645 A1* | 7/2010 | Kobayashi | H03F 1/565 333/32 |
| 2010/0301934 A1* | 12/2010 | Drogi | H03F 1/3247 330/127 |
| 2011/0043282 A1* | 2/2011 | Drogi | H03F 1/3247 330/131 |
| 2011/0309883 A1 | 12/2011 | Prikhodko et al. | |
| 2012/0044980 A1 | 2/2012 | Zhang | |
| 2012/0062285 A1 | 3/2012 | Allott | |
| 2013/0176079 A1 | 7/2013 | Uno et al. | |
| 2013/0190036 A1* | 7/2013 | Zhao | H03F 3/245 455/550.1 |
| 2015/0200631 A1 | 7/2015 | Outaleb | |
| 2015/0243649 A1 | 8/2015 | Brech et al. | |
| 2015/0333711 A1 | 11/2015 | Langer | |
| 2016/0006476 A1* | 1/2016 | El-Rayis | H04B 1/18 455/78 |
| 2016/0013758 A1* | 1/2016 | Cao | H03F 1/0222 330/297 |
| 2016/0105153 A1 | 4/2016 | Chen et al. | |
| 2016/0142020 A1 | 5/2016 | Wang | |
| 2016/0181992 A1* | 6/2016 | Holmes | H03F 1/083 330/295 |
| 2016/0322993 A1* | 11/2016 | Yamanouchi | H04B 1/0483 |
| 2017/0149394 A1* | 5/2017 | Kao | H03F 3/45071 |
| 2017/0359032 A1 | 12/2017 | McLaren | |
| 2017/0366148 A1 | 12/2017 | Jang et al. | |
| 2017/0373645 A1 | 12/2017 | Jang et al. | |
| 2018/0102798 A9 | 4/2018 | Zhou | |
| 2018/0138870 A1 | 5/2018 | Nobbe et al. | |
| 2018/0167042 A1 | 6/2018 | Nagasaku | |
| 2019/0165753 A1 | 5/2019 | Arigong et al. | |

FOREIGN PATENT DOCUMENTS

| | | |
|---|---|---|
| EP | 3273596 A1 | 1/2018 |
| WO | 03081670 A1 | 10/2003 |
| WO | 2014068351 A2 | 5/2014 |
| WO | 2016057218 A1 | 4/2016 |
| WO | 2016207600 A1 | 12/2016 |

OTHER PUBLICATIONS

Chen, Kenle et al., "Design of Highly Efficient Broadband Class-E Power Amplifier Using Synthesized Low-Pass Matching Networks", IEEE Transactions on Microwave Theory and Techniques, vol. 59 , Issue: 12 , Oct. 11, 2011, pp. 3162-3173, IEEE.

Gao, Setal., "High-efficiency power amplifier design including input harmonic termination", IEEE Microwave and Wireless Components Letters, vol. 16, Issue 2, Feb. 1, 2006, pp. 81-83, IEEE.

Jundi, A et al., "An 85-W Multi-Octave Push-Pull GaN HEMT Power Amplifier for High Efficiency Communication Applications at Microwave Frequencies", IEEE Transactions on Microwave Theory and Techniques, vol. 63, Issue 11, Nov. 2015, pp. 3691-3700, IEEE.

Mohadeskasaei, Seyed A. et al., "Design of Broadband, High-Efficiency, and High Linearity GaN HEMT Class-J RF Power Amplifier", Progress in Electromagnetic Research C, vol. 72, Jan. 1, 2017, pp. 177-186, obtained from internet: www.jpier.org/PIERC/pierc72/18.17011905.pdf.

White, P M., "Effect of input harmonic terminations on high efficiency class-B and class-F operation of PHEMT devices", Microwave Symposium Digest, 1998 IEEE MTT-S International, Jun. 1998, pp. 1611-1614, IEEE.

Wilson, Richard et al., "Enhanced Instantaneous Bandwidth LDMOS RF Power Transistor Using Integrated Passive Devices", 2016 IEEE MTT-S International Microwave Symposium (IMS), May 22-27, 2016, 1-4, IEEE.

Zhu, Ning et al., "An Integrated RF Match and Baseband Termination Supporting 395 MHz Instantaneous Bandwidth for High Power Amplifier Applications", 2017 IEEE MTT-S International Microwave Symposium (IMS), Jun. 4-9, 2017, 1114-1117.

Doherty, W. H., "A New High Efficiency Power Amplifier for Modulated Waves", Proceedings of the Institute of Radio Engineers, vol. 24, No. 9, Sep. 1936, pp. 1163-1182.

\* cited by examiner

RF POWER AMPLIFIER WITH FREQUENCY SELECTIVE IMPEDANCE MATCHING NETWORK

RELATED APPLICATIONS

This application is a continuation of prior application Ser. No. 15/879,621, filed 25 Jan. 2018, the entire disclosure of which is being hereby incorporated by reference herein.

BACKGROUND

RF power amplifiers are used in a variety of applications such as base stations for wireless communication systems etc. RF power amplifiers are designed to provide linear operation without distortion. The signals amplified by the RF power amplifiers often include signals that have a high frequency modulated carrier having frequencies in the 400 megahertz (MHz) to 4 gigahertz (GHz) range. The baseband signal that modulates the carrier is typically at a relatively lower frequency and, depending on the application, can be up to 1 GHz.

One popular power amplifier architecture currently employed is the Doherty amplifier. The Doherty amplifier was first proposed by William H. Doherty, in 1936, and is described in "A new high efficiency power amplifier for modulated waves," Proc. IRE, vol. 24, pp. 1163-1182, September 1936, the content of which is incorporated by reference in its entirety. The Doherty amplifier employs a main amplifier which provides amplification at all power levels, and a peaking amplifier, which turns on once a high-power level threshold is crossed. Efficiency is enhanced through load modulation of the main amplifier from the peaking amplifier.

Designers of modern RF power amplifiers pay considerable attention to narrowband frequency limitations. For example, reactive components, such as capacitors, inductors, transmission lines, etc., that are employed in RF power amplifier circuit topologies including Doherty amplifiers, to provide phase shifting (e.g., for power combination) and impedance matching, represent one source of frequency limitation. These reactive components introduce a frequency dependence in the circuit whereby optimum efficiency is achieved only at a particular frequency value, and high efficiency is achieved only in a narrowband range. Accordingly, designers are seeking ways to improve the wideband impedance response of RF power amplifier circuit topologies without sacrificing power efficiency.

SUMMARY

An amplifier circuit is disclosed. According to an embodiment, the amplifier circuit includes an input port, an output port, and a reference potential port. The amplifier circuit additionally includes an RF amplifier device having an input terminal electrically coupled to the input port, an output terminal electrically coupled to the output port, and a reference potential terminal electrically coupled to the reference potential port. The RF amplifier device is configured to amplify an RF signal as between the input and output terminal across a fundamental frequency range. The amplifier circuit additionally includes an impedance matching network electrically connected to the output terminal, the reference potential port, and the output port. The impedance matching network includes a reactive efficiency optimization circuit connected in parallel with the output terminal and the reference potential terminal, and a reactive frequency selective circuit connected in series between the output terminal and the output port. The reactive efficiency optimization circuit includes reactive components that form a parallel resonant circuit with a characteristic output impedance of the RF amplifier device at a center frequency of the fundamental frequency range. The reactive frequency selective circuit includes reactive components with parameter values being selected such that the RF signal at an intrinsic output node of the RF amplifier device is substantially in phase with the RF signal at the combiner node at the center frequency, and such that the impedance matching network exhibits a linear transfer characteristic in a baseband frequency range, the baseband frequency range being below the fundamental frequency range.

According to another embodiment, the amplifier circuit includes an input port, an output port, and a reference potential port. The amplifier circuit additionally includes an RF amplifier device having an input terminal electrically coupled to the input port, an output terminal electrically coupled to the output port, and a reference potential terminal electrically coupled to the reference potential port. The RF amplifier device is configured to amplify an RF signal as between the input and output terminal across a fundamental frequency range. The amplifier circuit additionally includes an impedance matching network electrically connected to the output terminal, the reference potential port, and the output port. The impedance matching network includes a parallel branch that is in parallel with the output terminal and the reference potential terminal, and a series branch that connected in series between the output terminal and the output port. The series branch includes a first transmission path and a second transmission path. The parallel branch includes reactive components that form a parallel resonant circuit with a characteristic output impedance of the peaking amplifier at a center frequency of the fundamental frequency range. The first transmission path provides substantially zero phase shift between an intrinsic node of the RF amplifier device and the output port at the center frequency. The second transmission path provides a low impedance DC connection between the intrinsic node and the output port.

A Doherty Amplifier circuit is disclosed. According to an embodiment, the Doherty Amplifier includes a main amplifier that is configured to amplify an RF signal as between a main input terminal and a main output terminal across a fundamental frequency range, and a peaking amplifier that is configured to amplify the RF signal as between a peaking input terminal and a peaking output terminal across the fundamental frequency range. The Doherty Amplifier further includes an impedance transformer connected between the main output terminal and a combiner node, and an impedance matching network connected between the peaking output terminal and the combiner node. The impedance matching network includes a reactive efficiency optimization circuit and a reactive frequency selective circuit. The reactive efficiency optimization circuit includes reactive components that form a parallel resonant circuit with a characteristic output impedance of the peaking amplifier at a center frequency of the fundamental frequency range. Parameter values of the reactive frequency selective circuit element are selected such that the RF signal at an intrinsic node of the Doherty Amplifier is substantially in phase with the RF signal at the combiner node at the center frequency, and such that a transfer characteristic of the impedance matching network is substantially linear in a baseband frequency region that is below the fundamental frequency range.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 6, which includes FIGS. 6A, 6B and 6C, illustrates a comparison of various amplifier circuit topologies.

DETAILED DESCRIPTION

According to embodiments disclosed herein, a Doherty amplifier circuit includes an impedance matching circuit with two transmission paths. A first transmission path is designed to provide phase shifting in the fundamental frequency region, e.g., between 1.8 and 2.7 GHz (gigahertz). More particularly, the first transmission path can be tailored to provide zero phase shift at the center operating frequency, e.g., 2.2 GHz, between an intrinsic node of the peaking amplifier and the combiner node. This provides an RF signal at the combiner node of the Doherty amplifier that is exactly in phase, which is ideal for power combination. A second transmission path is designed to provide a low impedance path between the peaking amplifier and the combiner node in a baseband frequency region that is substantially lower than the fundamental frequency region, e.g., between 0 and 400 MHz (megahertz). This has the effect of shifting an unwanted impedance variation introduced by the phase shifting elements of the impedance matching circuit out of the baseband frequency region. As a result, the amplifier circuit provides high efficiency operation over a wideband frequency range. In one embodiment, the first and second transmission paths are provided by a parallel connected capacitor and inductor, wherein the capacitor provides the necessary phase shifting in the fundamental frequency region and the inductor provides the necessary low impedance signal transmission in the baseband frequency region.

Figure 1:
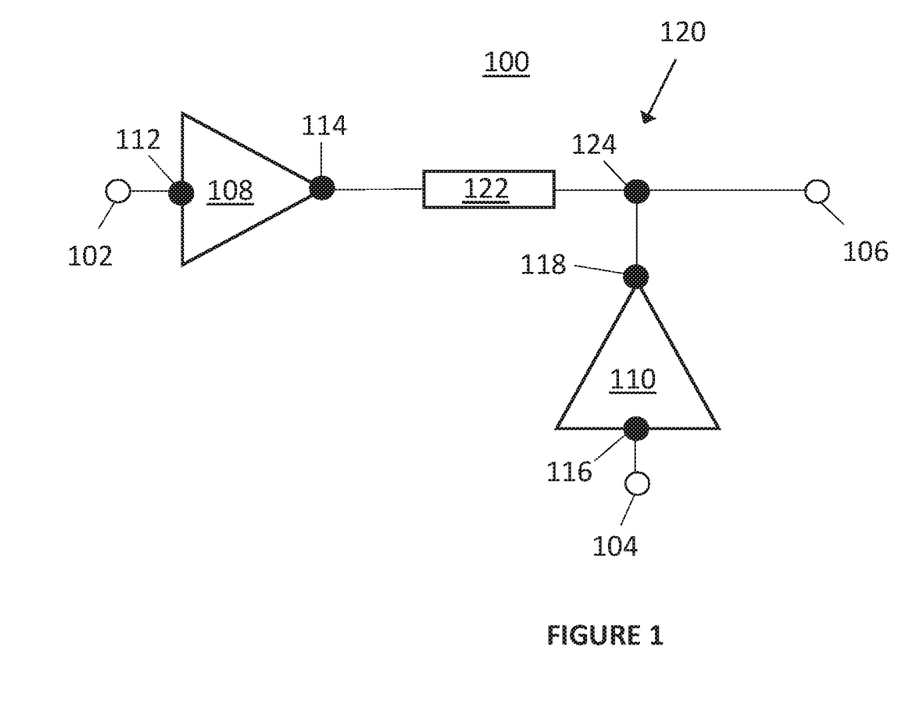
FIG. 1 depicts a Doherty amplifier circuit, according to an embodiment.

Referring to FIG. 1, a Doherty Amplifier 100 is depicted, according to an embodiment. The Doherty Amplifier 100 is configured to amplify an RF signal, e.g., an amplitude modulated (AM) signal or a frequency modulated (FM) signal. The RF signal is received at a main input port 102 and a peaking input port 104, and is outputted at an output port 106.

Amplification is provided using at least one of two amplifier devices, namely a main amplifier 108 and a peaking amplifier 110. The main amplifier 108 is configured to amplify the RF signal as between a main input terminal 112 and a main output terminal 114 across the fundamental frequency range. The peaking amplifier 110 is configured to amplify the RF signal as between a peaking input terminal 116 and a peaking output terminal 118 across the fundamental frequency range.

The Doherty Amplifier 100 operates in two different modes. In a low power mode, only the main amplifier 108 is active and the peaking amplifier 110 is turned off. In a high power mode, the peaking amplifier 110 turns on and supplements the amplification of the main amplifier 108. The output power of the RF signals generated by the main and peaking amplifiers 108, 110 is combined by a power combiner 120. The transition from low power mode to high power mode may be based upon the input amplitude of the RF signal. For example, the Doherty Amplifier 100 can transition to the high power mode when the input RF signal reaches 50% of the maximum signal amplitude.

The power combiner 120 is connected between the main output terminal 114, the peaking output terminal 118, and the output port 106. The power combiner 120 network includes an impedance transformer 122 (e.g., a quarter wave transmission line) connected between the main output terminal 114 and a combiner node 124. The impedance transformer 122 is tailored to provide load modulation to the devices of the Doherty Amplifier 100 across a power back-off region.

Figure 2:
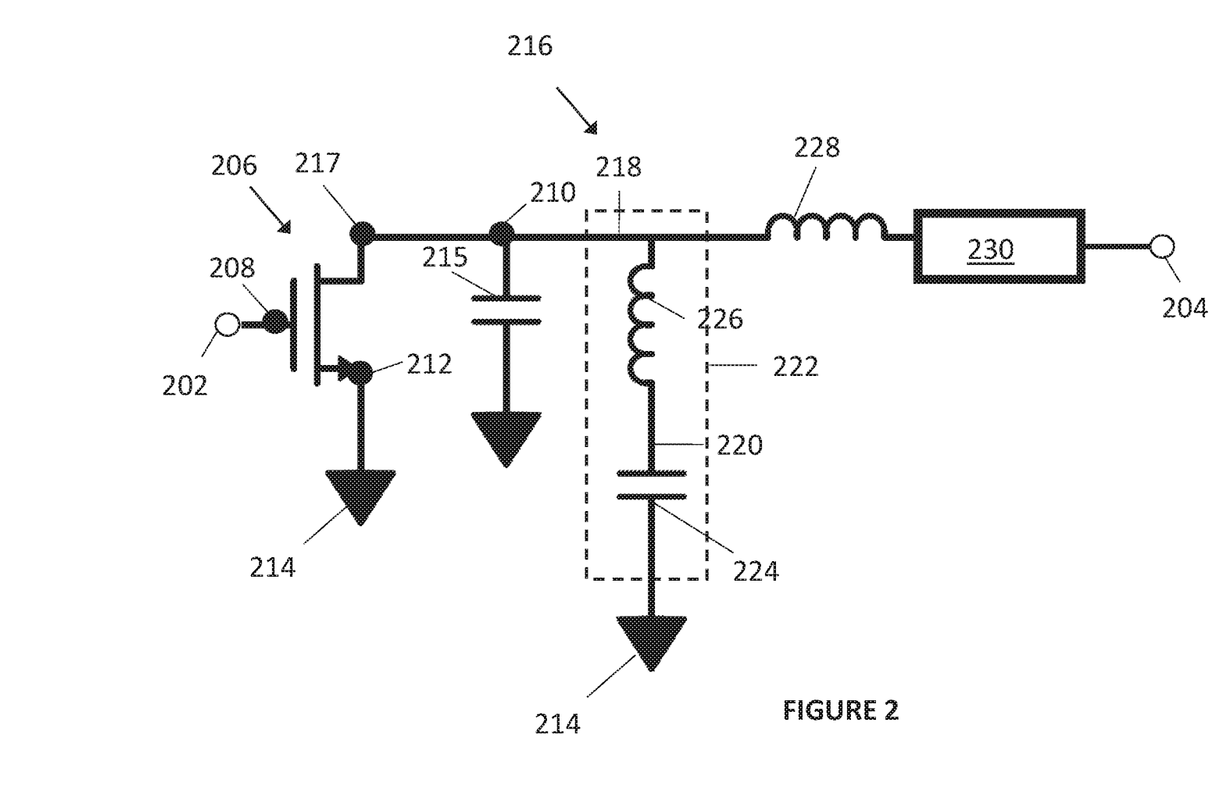
FIG. 2 depicts an amplifier circuit that includes a peaking amplifier and an impedance matching network, according to an embodiment.

Referring to FIG. 2, an amplifier circuit 200 is depicted, according to an embodiment. The amplifier circuit 200 may correspond to the peaking amplifier 110 side of the Doherty Amplifier 100 described with reference to FIG. 1, wherein an input port 202 of the amplifier circuit 200 is connected to the peaking input port 104 and an output port 204 of the amplifier circuit 200 is connected to the combiner node 124.

The amplifier circuit 200 includes an RF amplifier device 206 having an input terminal 208 electrically coupled to the input port 202, an output terminal 210 electrically coupled to the output port 204, and a reference potential terminal 212 electrically coupled to a reference potential port 214. Generally speaking, the RF amplifier device 206 can be any device that can perform amplification of an RF signal. In the depicted embodiment, the RF amplifier device 206 is a transistor device having an input terminal 208 that corresponds to a control terminal or gate terminal of the transistor device, an output terminal 210 that corresponds to a first load terminal (e.g., the drain terminal) of the transistor device, and a reference potential terminal 212 that corresponds to a second load terminal (e.g., the source terminal) of the transistor device. Examples of suitable transistors for the RF amplifier device 206 includes MOSFETs (metal-oxide semiconductor field-effect transistors), DMOS (double-diffused metal-oxide semiconductor) devices, GaN HEMTs (gallium nitride high electron mobility transistors), GaN MESFETs (gallium nitride metal-semiconductor field-effect transistors), LDMOS (laterally diffused metal-oxide semiconductor) devices, etc., and more generally any type of RF transistor device.

The RF amplifier device 206 is configured to amplify an RF signal across an RF frequency range as between the input and output terminals 208, 210 across a fundamental frequency range that includes a center frequency. In the following discussion, the fundamental frequency range is between 1.8 GHz (gigahertz) and 27 GHz, with a center frequency of 2.2 GHz. In addition, in the following discussion, the RF signal is a frequency modulated signal that is modulated by a 900 MHz (megahertz) carrier signal. Thus, the baseband frequency range is between 0-900 MHz.

As is known in the art, MOSFET devices, such as the depicted RF amplifier device 206, have an inherent drain-source capacitance. The intrinsic output capacitance of the RF amplifier device 206 is represented by an intrinsic capacitor 215. An intrinsic node 217 of the RF amplifier device 206 corresponds to an internal node that is before the intrinsic capacitor 215 in the transmission path.

The amplifier circuit 200 further includes an impedance matching network 216 electrically connected to the output terminal 210, the reference potential port 214, and the output port 204. The impedance matching network 216 includes a series branch 218 that is connected in series between the output terminal 210 and the output port 204 and a parallel branch 220 that is in parallel with the output terminal 210 and the reference potential terminal 212.

The impedance matching network 216 includes reactive components, namely inductors and capacitors. As will be discussed in further detail below, the parameters of these inductors and capacitors (i.e., inductance and capacitance) are specifically tailored to provide a desired frequency response in a given frequency range. More generally, the reactive components of the impedance matching network 216 can be provided by any of a variety of components (e.g., radial stubs, transmission lines, etc.) wherein the parameters of these components (e.g., radius, length, etc.) are tailored to provide the desired frequency response.

The parallel branch 220 of the impedance matching network 216 includes a reactive efficiency optimization circuit 222. In the depicted embodiment, the reactive efficiency optimization circuit 222 includes a first capacitor 224 and a first inductor 226. The first capacitor 224 and the first inductor 226 are connected in series with one another along the parallel branch 220. The inductance of the first inductor 226 is tailored to provide impedance matching with respect to a characteristic output impedance of the RF amplifier device 206, specifically, the intrinsic capacitor 215. As is generally known in the art, parallel LC circuits provide maximum impedance (from an RF perspective) at a resonant frequency, i.e., the point at which reactive branch currents are equal and opposite. According to an embodiment, the inductance of the first inductor 226 is tailored to form a parallel resonator with the intrinsic capacitor 215 that resonates at the center frequency of 2.2 GHz. The first capacitor 224 is configured as a DC blocking capacitor that blocks very low frequencies (e.g., frequencies of less than 10 MHz) and DC signals. Thus, the DC blocking capacitor has a very large capacitance value. Accordingly, at much higher frequency values including the fundamental frequency range, the first capacitor 224 appears as an RF short. In this way, the effects of the first capacitor 224 on the parallel LC resonator can be disregarded when tailoring the parameters of the parallel LC resonator.

The series branch 218 of the impedance matching network 216 includes a second inductor 228 and a first transmission line 230. The second inductor 228 and the first transmission line 230 represent parasitic components of the amplifier circuit 200 when practically implemented. For example, in one practical implementation, the amplifier circuit 200 is packaged on a metal flange with a conductive die pad, an electrically insulating window frame surrounding the die pad, and electrically conductive leads formed on the window frame and extending away from the package. An example of this RF package configuration is disclosed in U.S. patent Ser. No. 15/823,155 to Arigong, the content of which is incorporated by reference in its entirety. In such a configuration, the RF amplifier device 206 is provided by a transistor die that is mounted on the die pad. Electrically conductive bond wires provide the electrical connection between the output terminal of the transistor die (e.g., the drain) and the package lead. These wire conductions have an inherent inductance, which is schematically represented by the second inductor 228. The electrically conductive leads also introduce an impedance between the output terminal of transistor die and the printed circuit board, which is schematically represented as the first transmission line 230.

Figure 3:
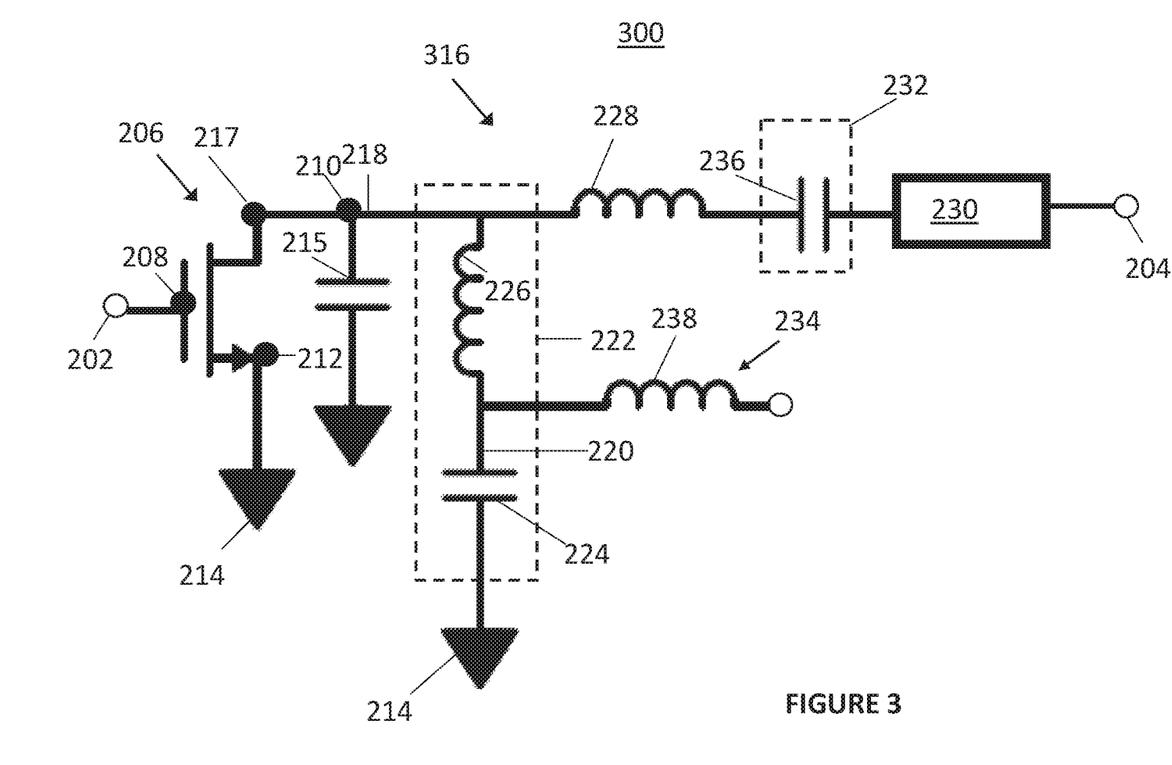
FIG. 3 depicts an amplifier circuit that includes a peaking amplifier and an impedance matching network with a fundamental frequency phase compensation element, according to an embodiment.

Referring to FIG. 3, an amplifier circuit 300 is depicted, according to another embodiment. The amplifier circuit 300 is identical to the amplifier circuit 200 of FIG. 2 with the exception that the amplifier circuit 300 of FIG. 3 includes a modified impedance matching network 316 that additionally includes a reactive phase compensation element 232 and a DC feeding network 234.

The reactive phase compensation element 232 is configured to compensate for the parasitic components of the impedance matching network 316 that introduce a phase delay in the propagation of the RF signal between the output terminal 210 and the output port 204, including the first transmission line 230 and the second inductor 228. That is, the reactive phase compensation element 232 is configured to present an opposing reactance that counteracts the reactance of the second inductor 228 and the first transmission line 230 such that the series branch 218 acts as an RF short at a given frequency. For example, according to an embodiment, an impedance of the reactive phase compensation element 232 is selected such that the RF signal at the intrinsic node 217 is substantially in phase with the RF signal at the output port 204 (which can correspond to a combiner node 124 in a Doherty Amplifier 100 configuration) at the center frequency.

In the depicted embodiment, the reactive phase compensation element 232 is provided by a second capacitor 236. As is known, in a series connected LC circuit, there is a resonant frequency at which the inductance of the inductive elements is equal in magnitude and opposite in sign as the capacitance of the capacitive elements. Applying this principle, the capacitance of the second capacitor 236 can be tailored relative to the inductances of the second inductor 228 and the first transmission line 230 to provide phase compensation, e.g., at the center frequency. The position of the reactive phase compensation element 232 along the series branch 218 can be different from the depicted embodiment. For example, the reactive phase compensation element 232 can be positioned between the intrinsic node 217 and the second inductor 228.

Although the second capacitor 236 can beneficially be used to provide phase shift compensation in the above described manner, one potential drawback of the circuit topology shown in FIG. 3 is that the second capacitor 236 introduces a DC (direct current) blocking component in the series branch 218. That is, any DC voltage that appears at the intrinsic node 217 is disconnected from the output port 204. One solution to this issue is to provide the DC feeding network 234 in the impedance matching network 316. FIG. 3 represents one potential location for a DC feeding network 234. More generally, the DC feeding network 234 can be positioned at a variety of locations in the impedance matching network 316. The DC feeding network 234 is used to provide an independent DC bias at the output port 204. In various embodiments, the DC feeding network 234 can include an RF choke 238 to filter out higher frequency signals.

Figure 4:
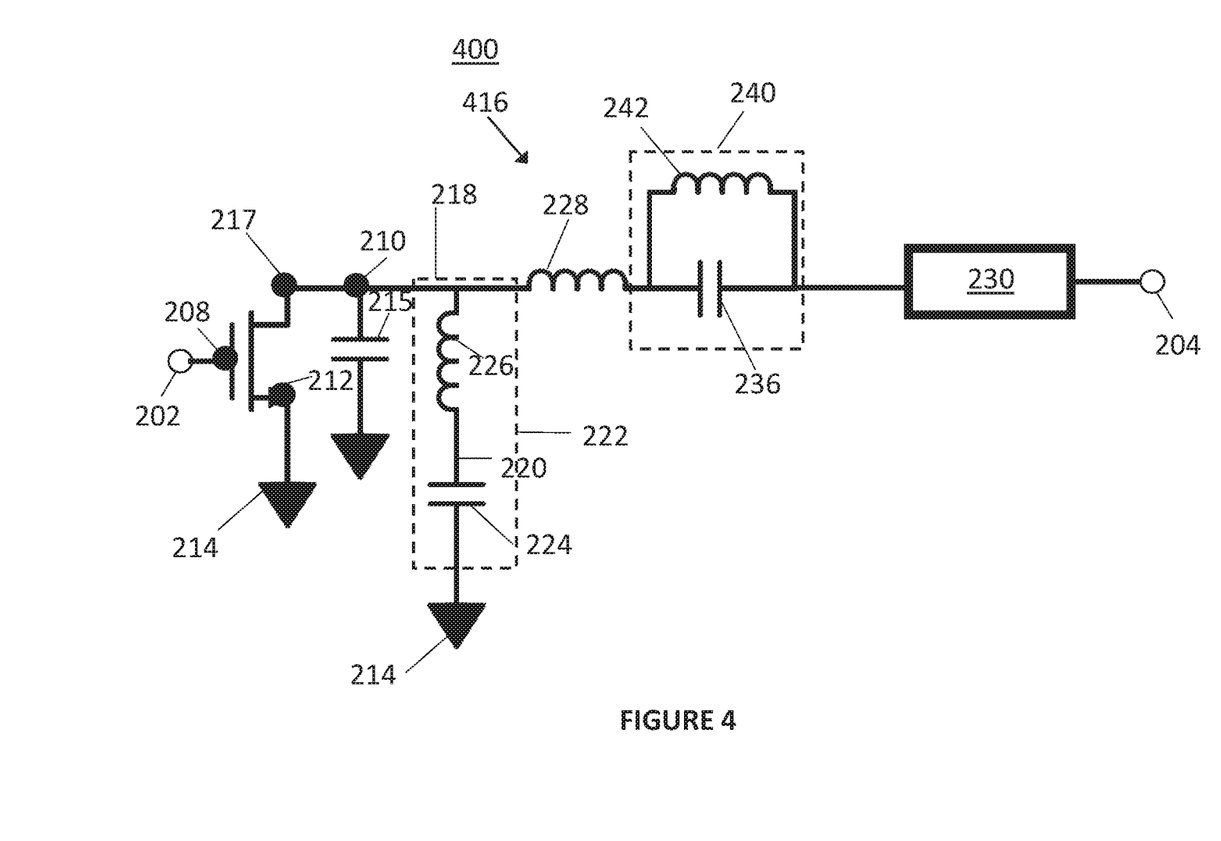
FIG. 4 depicts an amplifier circuit that includes a peaking amplifier and an impedance matching network with a fundamental frequency phase compensation element and a baseband frequency region bypass inductor, according to an embodiment.

Referring to FIG. 4, an amplifier circuit 400 is depicted, according to an embodiment. The amplifier circuit 400 is identical to the amplifier circuit 300 of FIG. 3 with the exception that the amplifier circuit 400 of FIG. 4 includes a modified impedance matching network 416 that includes a reactive frequency selective circuit 240 in place of the reactive phase compensation element 232 described with reference to FIG. 3. The reactive frequency selective circuit 240 is designed to meet two criteria. First, the reactive frequency selective circuit 240 is configured such that the RF signal at the intrinsic node 217 is substantially in phase with the RF signal at the output port 204 at the center frequency. That is, the reactive frequency selective circuit 240 is configured to provide phase shift compensation in a similar manner as the reactive phase compensation element 232 described with reference to FIG. 3. Second, the reactive frequency selective circuit 240 is configured to provide a DC and low-frequency transmission path between the intrinsic node 217 and the output port 204. That is, the reactive frequency selective circuit 240 is configured to avoid the DC blocking issue created by the second capacitor 236, as discussed above.

In the depicted embodiment, the reactive frequency selective circuit 240 includes a second capacitor 236 and a third inductor 242. The third inductor 242 is connected in parallel with the second capacitor 236 along the series branch 218. As a result, the series branch 218 includes two transmission paths for the RF signal. A first transmission path includes the second inductor 228, the second capacitor 236, and the first transmission line 230. A second transmission path includes the second inductor 228, the third inductor 242, and the first transmission line 230.

Parameter values of the third inductor 242 and the second capacitor 236 are selected such that the second capacitor 236 provides a dominant transmission path for the RF signal in the fundamental frequency range and such that the third inductor 242 provides a dominant transmission path for the RF signal in the baseband frequency range. That is, the capacitance of the second capacitor 236 predominates in the fundamental frequency range such that the RF signal mainly propagates along the first transmission path and the third inductor 242 appears as an RF open. Meanwhile, the inductance of the third inductor 242 predominates in the baseband frequency range such that the baseband signal mainly propagates along the second transmission path and the second capacitor 236 appears as a DC or low frequency open.

In addition, parameter values of the second capacitor 236 and the third inductor 242 are selected such that the transmission path that includes the second inductor 228, the reactive frequency selective circuit 240, and the first transmission line 230 collectively provide zero phase shift to the RF signal at the center frequency of 2.2 GHz. This is done by tailoring the capacitance of the second capacitor 236 to provide an opposing reactance that counteracts the inductances present in the series branch 218 such that the series branch 218 appears as an RF short at the center frequency in the manner described with reference to FIG. 3. In this example, the inductance of the third inductor 242 is accounted for in tailoring the capacitance of the second capacitor 236.

Advantageously, from a DC perspective, the second transmission path provides a complete low impedance connection between the intrinsic node 217 and the output port 204. Accordingly, the DC feeding network 234 in the amplifier circuit 300 of FIG. 3 is no longer necessary and can therefore be omitted.

Figure 5:
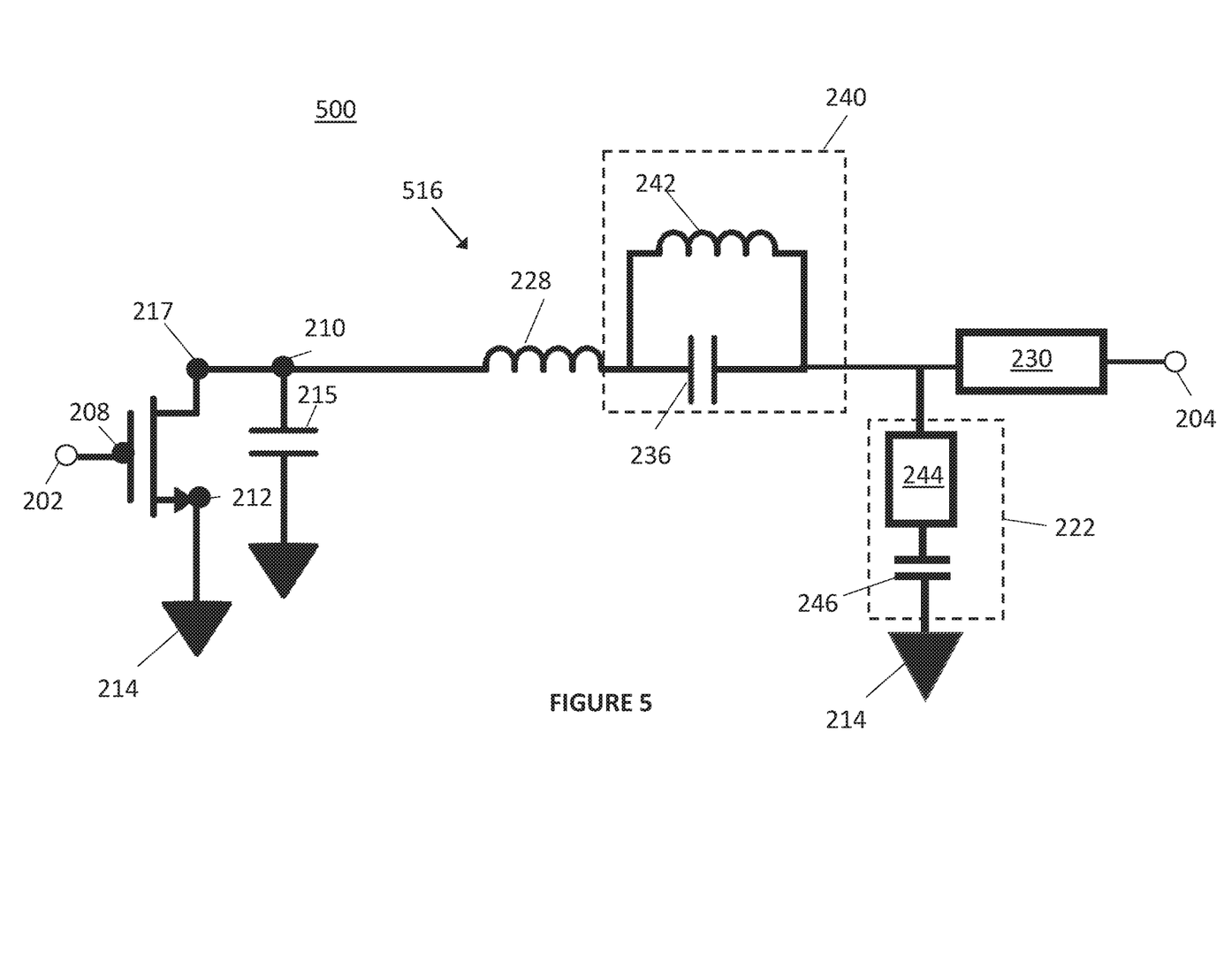
FIG. 5 depicts an amplifier circuit that includes a peaking amplifier and an impedance matching network with a baseband frequency region bypass inductor, according to another embodiment.

Referring to FIG. 5, an amplifier circuit 500 is depicted, according to an embodiment. The amplifier circuit 500 is identical to the amplifier circuit 400 of FIG. 4, with the exception that the amplifier circuit 500 of FIG. 5 includes a modified impedance matching network 516 wherein the reactive efficiency optimization circuit 222 is reconfigured. Instead of providing the first inductor 226 to form a parallel LC resonator as described in the embodiments of FIGS. 2-4, the embodiment of FIG. 5 includes a second transmission line 244 connected in parallel with the intrinsic node 217 and the reference potential terminal 212. The parameters of the second transmission line 244 are selected to form a parallel LC resonator with the intrinsic capacitor 215 in a similar manner as previously described with respect to the first inductor 226. The second transmission line 244 may be connected to a third capacitor 246 that is a DC blocking capacitor that blocks very low frequencies (e.g., frequencies of less than 10 MHz) and DC signals in a similar manner as previously described with respect to the first capacitor 224 described with reference to FIG. 2. Whereas the reactive efficiency optimization circuit 222 configuration of FIGS. 2-4 may be easier to implement at the package level, e.g., using discrete chip capacitors and bond wires, the reactive efficiency optimization circuit 222 configuration of FIG. 5 may be easier to implement at the system level, e.g., using an appropriately tailored RF transmission line and discrete capacitor on a printed circuit board.

Referring to FIG. 6, various models for simulating the output impedance presented to the peaking amplifier 110 of the Doherty Amplifier 100 circuits are depicted. The models schematically represent an impedance between and an intrinsic node 107 of the main amplifier 108 and the output port 106 of the Doherty Amplifier 100.

Figure 6A:
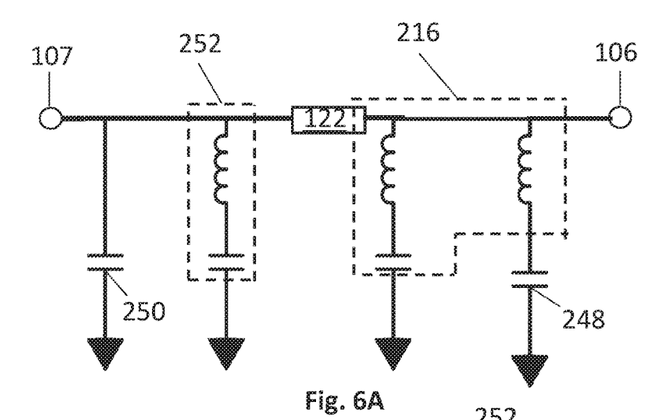
FIG. 6A illustrates a model of a Doherty amplifier circuit with no phase compensation element and no baseband frequency region bypass inductor, according to an embodiment.

Referring to FIG. 6A, a model of a Doherty Amplifier circuit with no phase compensation element and with no DC bypass is depicted. This model includes the impedance matching network 216 described with reference to FIG. 2. An output capacitance of the peaking amplifier 110 is represented by a fourth capacitor 248. In addition, the model includes an impedance transformer 122 between the main and peaking amplifiers 108, 112, which is used to transform the impedance seen by the main amplifier 108, e.g., as described with reference to FIG. 1. In addition, an output capacitance of the main amplifier 108 is represented by a fifth capacitor 250. In addition, the model includes a fourth LC branch 252 that is configured to form a parallel resonant circuit with the output capacitance of the main amplifier 108 in a similar manner as previously described with reference to the reactive efficiency optimization circuit 222.

Figure 6B:
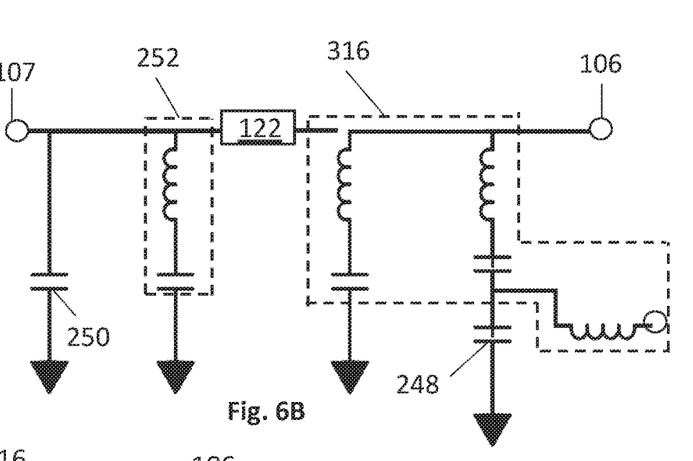
FIG. 6B illustrates a model of a Doherty amplifier circuit with a phase compensation element and no baseband frequency region bypass inductor, according to an embodiment.

Referring to FIG. 6B, a model of a Doherty Amplifier 100 circuit with phase compensation element and with no DC bypass is depicted. This model is identical to the model described with reference to FIG. 6A, with the exception that the impedance matching network 316 described with reference to FIG. 3 replaces the impedance matching network 216.

Figure 6C:
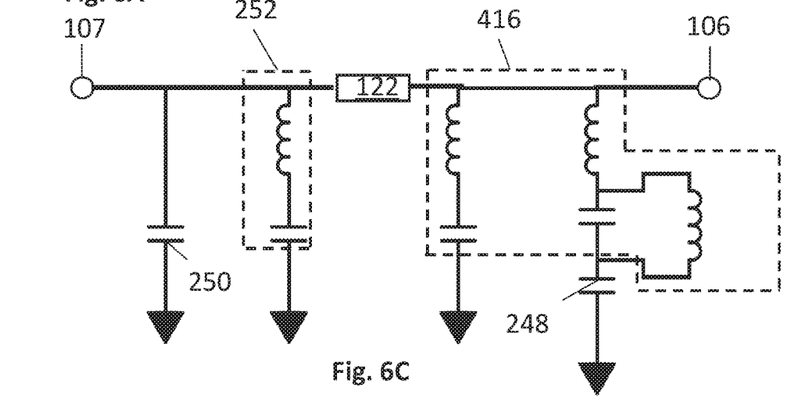
FIG. 6C illustrates a model of a Doherty amplifier circuit with a phase compensation element and a baseband frequency region bypass inductor, according to an embodiment.

Referring to FIG. 6C, a model of a Doherty Amplifier 100 circuit with phase compensation element and with DC bypass is depicted. This model is identical to the model described with reference to FIG. 6A, with the exception that the impedance matching network 416 described with reference to FIG. 4 replaces the impedance matching network 216.

Figure 7:
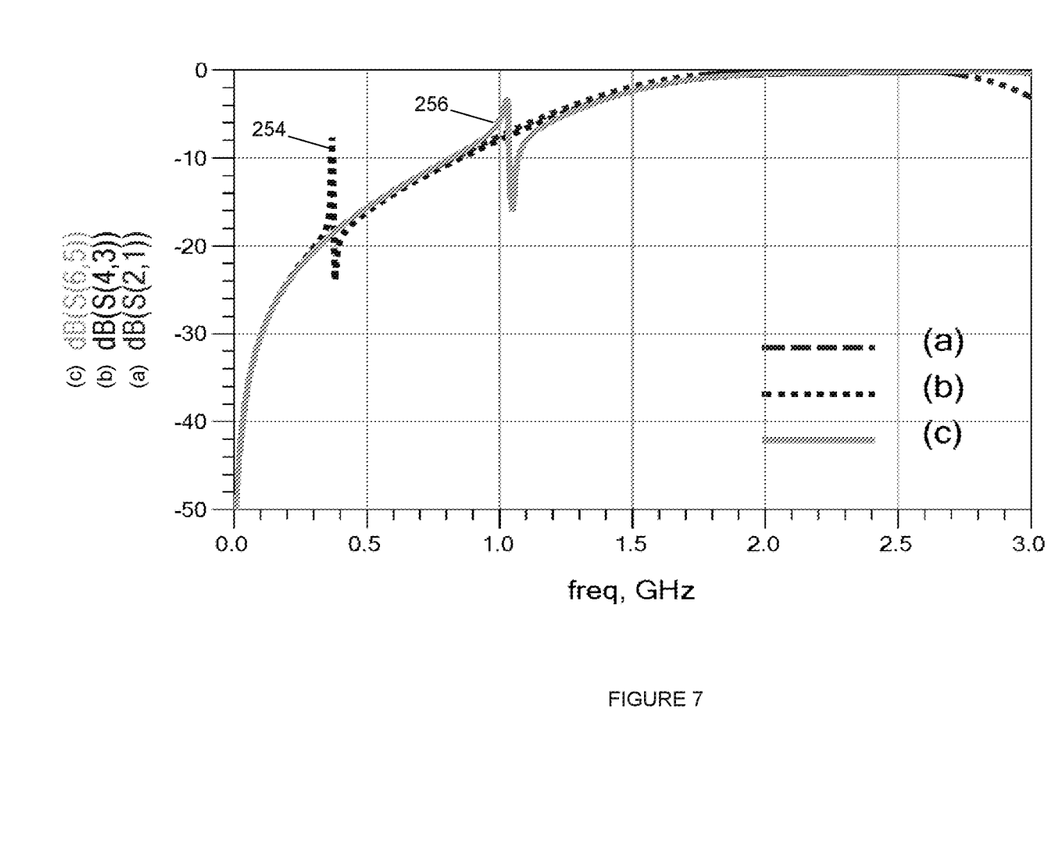
FIG. 7 illustrates the transfer characteristics of the Doherty amplifier circuits of FIGS. 6A, 6B and 6C.

Referring to FIG. 7, transfer characteristics of the various Doherty Amplifier 100 output networks represented in FIGS. 6A, 6B, and 6C are depicted. The transfer characteristics measure the gain of an RF signal propagating across the network, which is represented in decibels (dB) on the Y axis, versus frequency of the RF signal, which is represented in gigahertz (GHz) on the X axis. Curve (a) corresponds to the transfer characteristics of the model described with reference to FIG. 6A. Curve (b) corresponds the transfer characteristics of the model described with reference to FIG. 6B. Curve (c) corresponds to the transfer characteristics of the model described with reference to FIG. 6C.

For each of the circuit models, the RF signal is effectively completely transmitted (i.e., with a gain at or very close to zero) in the fundamental frequency region of 1.8 GHz-2.7 GHz.

Meanwhile, each of the circuit models display different characteristics in the baseband frequency region of 0-900 MHz. Curve A shows a linear transfer characteristic in the baseband frequency range. A linear transfer characteristic in the baseband frequency range is preferable for the transmission of DC currents for the reasons previously explained. However, while the transfer characteristics of curve A are preferable from an impedance matching perspective, one drawback of the Doherty Amplifier 100 circuit modeled in FIG. A is the unfavorable phase shifting as previously discussed, due to the presence of the parasitic components in the transmission path. Thus, the RF signal is disadvantageously skewed out of phase. As previously explained, the inclusion of the second capacitor 236 as a phase compensating element eliminates this skew. However, as shown in Curve (b), the inclusion of the phase compensating element introduces an abrupt variation 254 in the transfer characteristics in the baseband frequency region. In particular, in the region between 400-500 MHz, the gain of the circuit abruptly increases from about −20 dB to about −8 dB, and then abruptly decreases to about −24 dB. Thus, the gain of the circuit departs from a linear response whereby the gain of the circuit increases proportionally with increasing frequency. This abrupt transition 254 is attributable to the inclusion of the second capacitor 236 as the phase compensating element as well as the RF choke 238 in the DC feeding circuit. This abrupt transition 254 is undesirable. In particular, the abrupt transition 254 makes linearization more difficult and introduces memory effects.

Referring to Curve (c), an abrupt transition 256 is favorably shifted out of the baseband frequency region and into the frequency region that is between the baseband frequency region and the fundamental frequency region (i.e., between 900 MHz and 1.8 GHz). This favorable shift is attributable to the inclusion of the reactive frequency selective circuit 240, which includes the second inductor 228. The parameters of the second inductor 228 are determined to bring about this shift of the abrupt transition 254 out of the baseband frequency region.

In the above examples, a Doherty Amplifier is used as an exemplary amplifier circuit to illustrate the beneficial aspects of an impedance matching circuit that includes a reactive frequency selective circuit. Moreover, in the above example, the impedance matching circuit acts as an output impedance network for the peaking amplifier. However, corresponding design principles can be applied in other circuit positions. For example, an impedance matching circuit having a similar or identical topology as any of the embodiments described herein can be provided as the output impedance network for the main amplifier. Moreover, corresponding principles can be applied to the input side impedance matching networks of the peaking and/or main amplifier. More generally, the impedance matching circuit is not limited to Doherty Amplifier circuit topologies and more generally may be applied to any multipath amplifier circuit that combined the RF power of two amplified signals.

As used herein, "substantially in phase" refers to a variation in phase of no greater than ten degrees.

As used herein, a "dominant transmission path" refers to a transmission path in which at least ninety percent of the current flowing between two nodes flows through the dominant transmission path.

As used herein, a "linear transfer characteristic" refers to a transfer characteristic whereby a gain of the circuit increases proportionally with increasing frequency and fluctuations in gain, i.e., departures from the linear proportional relationship, along the linear region do not exceed more than 2 dB.

Terms such as "same," "match" and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like, are used to describe various elements, regions, sections, etc. and are also not intended to be limiting. Like terms refer to like elements throughout the description.

The term "directly electrically connected" or "electrically connected" describes a permanent low-impedance connection between electrically connected elements, for example a wire connection between the concerned elements. By contrast, the term "electrically coupled" means that one or more intervening element(s) configured to influence the electrical signal in some way (either in the real or imaginary domain) is provided between the electrically coupled elements. These intervening elements include active elements, such as transistors, as well as passive elements, such as inductors, capacitors, diodes, resistors, etc.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An amplifier circuit, comprising:
an RF amplifier comprising an input terminal, an output terminal, and a reference potential terminal, the RF amplifier configured to amplify an RF signal across a fundamental frequency range; and
an impedance matching network electrically connected to the output terminal and the reference potential terminal, the impedance matching network configured to:
match a characteristic output impedance of the RF amplifier at a center frequency of the fundamental frequency range;
provide an RF signal at an intrinsic node of the RF amplifier substantially in phase with an RF signal at the output port at the center frequency; and
exhibit a linear transfer characteristic in a baseband frequency range below the fundamental frequency range.

2. The amplifier circuit of claim 1, wherein the impedance matching network comprises:
an efficiency optimization circuit connected in parallel with the output terminal and the reference potential terminal, and configured to match the characteristic output impedance; and
a frequency selective circuit connected in series between the output terminal and an output port of the amplifier circuit, and configured to provide the RF signal at the intrinsic node substantially in phase with the RF signal at the output port and to exhibit the linear transfer characteristic in the baseband frequency range.

3. The amplifier circuit of claim 2, wherein the frequency selective circuit comprises a capacitor and an inductor electrically connected in parallel with one another, and wherein the capacitor and the inductor are each electrically connected in series between the output terminal and the output port.

4. The amplifier circuit of claim 3, wherein parameter values of the capacitor and the inductor are such that:
the capacitor provides a dominant transmission path for the RF signal in the fundamental frequency range; and
the inductor provides a dominant transmission path for the RF signal in the baseband frequency range.

5. The amplifier circuit of claim 3, wherein the impedance matching network comprises a parasitic inductance connected in series between the output terminal and the output port, and wherein parameter values of the capacitor and the inductor are selected such that the parasitic inductance, the capacitor, and the inductor collectively provide substantially zero phase shift to the RF signal between the intrinsic node and the output port at the center frequency.

6. The amplifier circuit of claim 2, wherein parameter values of the frequency selective circuit are selected to shift a non-linear transfer characteristic region of the impedance matching network into a frequency range that is between the baseband frequency range and the fundamental frequency range.

7. The amplifier circuit of claim 6, wherein the fundamental frequency range comprises frequencies in the range of 1.8-2.7 GHz, and wherein the baseband frequency range comprises frequencies in the range of 0-900 MHz.

8. An amplifier circuit, comprising:
an RF amplifier comprising an input terminal, an output terminal, and a reference potential terminal, the RF amplifier configured to amplify an RF signal across a fundamental frequency range; and
an impedance matching network electrically connected to the output terminal and the reference potential terminal, the impedance matching network configured to:
form a parallel resonant circuit with a characteristic output impedance of the RF amplifier at a center frequency of the fundamental frequency range,
form a first transmission path with a substantially zero phase shift between an intrinsic node of the RF amplifier and the output port at the center frequency, and
form a second transmission path with a low impedance DC connection between the output terminal and the output port to pass DC signals between the output terminal and the output port.

9. The amplifier circuit of claim 8 wherein the impedance matching network comprises:
a parallel branch, connected between the output terminal and the reference potential terminal, that forms the parallel resonant circuit; and
a series branch, connected in series between the output terminal and an output port of the amplifier circuit, the series branch comprising the first transmission path and the second transmission path.

10. The amplifier circuit of claim 9, wherein the series branch comprises capacitor connected in parallel with an inductor, wherein the first transmission path comprises the capacitor, and wherein the second transmission path comprises the inductor.

11. The amplifier circuit of claim 10, wherein the impedance matching network comprises a parasitic inductance connected in series between the output terminal and the output port, and wherein the capacitor and the inductor are configured such that the parasitic inductance, the capacitor, and the inductor collectively provide the substantially zero phase shift to the RF signal between the intrinsic node and the output port at the center frequency.

12. The amplifier circuit of claim 8, wherein the impedance matching network is devoid of an independent DC feeding network.

13. A Doherty Amplifier circuit, comprising:
a main amplifier configured to amplify an RF signal between a main input terminal and a main output terminal across a fundamental frequency range;
a peaking amplifier configured to amplify the RF signal between a peaking input terminal and a peaking output terminal across the fundamental frequency range;
an impedance transformer connected between the main output terminal and a combiner node; and
an impedance matching network connected between the peaking output terminal and the combiner node configured to:
form a parallel resonant circuit with a characteristic output impedance of the peaking amplifier at a center frequency of the fundamental frequency range;
provide an RF signal at an intrinsic node of the peaking amplifier substantially in phase with an RF signal at the combiner node at the center frequency; and
exhibit a substantially linear transfer characteristic in a baseband frequency range below the fundamental frequency range.

14. The Doherty Amplifier circuit of claim 13, wherein the impedance matching network comprises:
an efficiency optimization circuit configured to form the parallel resonant circuit with the characteristic output impedance of the peaking amplifier at the center frequency of the fundamental frequency range; and a frequency selective circuit configured to;
provide the RF signal at the intrinsic node of the peaking amplifier substantially in phase with the RF signal at the combiner node at the center frequency; and
exhibit the substantially linear transfer characteristic in the baseband frequency range.

15. The Doherty Amplifier circuit of claim 14, wherein the frequency selective circuit comprises a capacitor and an inductor electrically connected in parallel with one another, and wherein the capacitor and the inductor are each electrically connected in series between the peaking output terminal and the combiner node.

16. The Doherty Amplifier circuit of claim 15, wherein parameter values of the second capacitor and the inductor are selected such that:
the capacitor provides a dominant transmission path for the RF signal in the fundamental frequency range; and
the inductor provides a dominant transmission path for the RF signal in the baseband frequency range.

17. The Doherty Amplifier circuit of claim 15, wherein the impedance matching network comprises a parasitic inductance connected in series between the peaking output terminal and the combiner node, and such that the parasitic inductance, the capacitor, and the inductor collectively provide substantially zero phase shift to the RF signal between the intrinsic node and the combiner node at the center frequency.

* * * * *